United States Patent [19]

Schuurmans et al.

[11] Patent Number: 5,053,243
[45] Date of Patent: Oct. 1, 1991

[54] PREPARATION OF ADSORBENT LAYERS

[75] Inventors: Hubertus J. A. Schuurmans; Paulus C. N. Crouzen; Gerard Hoekstein, all of Amsterdam, Netherlands

[73] Assignee: Shell Oil Company, Houston, Tex.

[21] Appl. No.: 586,125

[22] Filed: Sep. 21, 1990

[30] Foreign Application Priority Data

Jan. 2, 1990 [GB] United Kingdom ............... 9000026

[51] Int. Cl.⁵ .............................................. B05D 3/06
[52] U.S. Cl. ........................................ 427/37; 427/38; 427/41; 427/44
[58] Field of Search .................. 427/39, 37, 38, 41, 427/44

Primary Examiner—Bernard Pianalto
Attorney, Agent, or Firm—Ronald R. Reper

[57] ABSTRACT

A process for the preparation of adsorbent layer upon a non-permeable substrate comprising
a) generating plasma by introducing a non-polymerizable fluid into a plasma generation zone using a direct current arc;
b) introducing hydrocarbonaceous monomers into said plasma generation zone thereby forming polymerizable hydrocarbonaceous compounds, setting a ratio of flow rates of the hydrocarbonaceous monomers and the non-polymerizable fluid in the range from >0–0.001; and
c) contacting the substrate with the glowing zone of said plasma.

10 Claims, 2 Drawing Sheets

PREPARATION OF ADSORBENT LAYERS

BACKGROUND OF THE INVENTION

Field of the Invention

The invention relates to a process for the preparation of an adsorbent layer upon a non-permeable substrate, said layer being suitable for example for adsorbing hydrocarbonaceous compounds or carbon dioxide.

Among the known processes for preparing permeable layers like membrane layers plasma treating of a substrate with an inert gas, which may be combined with a polymerizable hydrocarbonaceous compound, is known to be suitable for the preparation of non-porous (i.e. dense) selective top layers of composite multi-layer membranes. In particular by contacting the above substrate with the glowing zone of a plasma and depositing said compound modified in said plasma upon said substrate, very selective membrane layers can be prepared which layers are, moreover, non-porous.

Surprisingly, it has now been found that such a process applied to non-permeable substrates results in adsorbent layers having loading ranges far extending from loading ranges of well known adsorbents like active coal.

SUMMARY OF THE INVENTION

Therefore the invention provides a composite material consisting of an adsorbent layer deposited on a non permeable substrate obtainable by a process comprising the steps of
- generating a plasma by introducing a non-polymerizable fluid into a plasma generation zone using a direct current arc,
- introducing hydrocarbonaceous monomers into said plasma thereby forming polymerizable hydrocarbonaceous compounds, setting a ratio of flow rates of the hydrocarbonaceous monomers and the non-polymerizable fluid in the range from >0-0.001, and
- contacting the substrate with the glowing zone of said plasma.

Furthermore the invention provides a process for the preparation of an adsorbent layer upon a non-permeable substrate, comprising the steps of,
- generating a plasma by introducing a non-polymerizable fluid into a plasma generation zone using a direct current arc,
- introducing hydrocarbonaceous monomers into said plasma generation zone thereby forming polymerizable hydrocarbonaceous compounds, setting a ratio of flow rates of the hydrocarbonaceous monomers and the non-polymerizable fluid in the range from >0-0.001, and
- contacting the substrate with the glowing zone of said plasma.

DESCRIPTION OF PREFERRED EMBODIMENTS

Advantageously, the substrate is formed of a metal, preferably aluminium.

The use of plasmas for depositing layers such as membrane layers is well known. The plasmas as used in this field of technique are suitably generated in an enclosed space by transferring energy (e.g. thermal or electromagnetic) to a gas contained in the enclosed space and thereby producing reactive plasma particles such as electrons, ions, radicals, molecular fragments and atoms in the ground state or in an excited state.

Furthermore a direct current (DC) arc has been used as plasma generation means for forming a flux of radicals to be deposited as diamond like carbon layers which in particular are used in the field of integrated circuit (IC) technology. Said plasma is generated in an electrodeless plasma generation zone (in order to avoid contamination of the hydrocarbonaceous membrane-forming compound(s) with electrode material) by means of capacitive or inductive coupling. For example, said plasma is generated inside a central channel of a cascade arc plasma generator, said generator being placed in a first pressure controlled zone and producing a plasma beam into a second reactor or plasma reactant deposition zone.

The plasma is visible in the vicinity of the electromagnetic energy source as a glow; the glow is a qualitative indication for the electron density of the plasma which is relatively high close to the energy source and decreases at increased distance from the plasma generation zone. The area in which a visible glow is present is the glowing zone. In the zone of argon containing plasmas photoemission from excited argon atoms results in a blue glow.

When the above said hydrocarbonaceous monomers are introduced into the plasma generation zone the dissociation of the hydrocarbonaceous molecules, i.e. the amount of inter-atomic bonds that break, can be influenced by (1) varying the ratio of the fluid flow rates of the hydrocarbonaceous compound(s) and of the plasma-forming fluid; (2) varying the power supplied to the plasma; (3) varying respective zone pressures; and (4) varying the residence time of particles in the reactor zone.

Surprisingly, the above plasma generation means used under operation conditions which differ substantially from the above IC producing requirements result in composites having high adsorption rates. In particular the above-mentioned ratio of flow rates in the range very slightly above 0, e.g., from >0 to 0.001 is applied on compounds which are deposited on non-permeable substrates. Advantageously the arc currents are in the range from 5 to 100 A and the arc voltages in the range from 50 to 100 V.

The process in accordance with the invention is advantageously carried out in the presence of a non-polymerizable plasma-forming fluid e.g. an inorganic gas such as nitrogen, hydrogen, oxygen, ammonia and/or carbon dioxide, and in particular an inert gas; more particularly said fluid contains at least one element from Group 0 of the Periodic Table of the Elements, more particularly argon; mixtures of argon with hydrogen and/or helium can be also suitably used as plasma-forming fluid.

Reference is made to the Periodic Table of the Elements as given in the Handbook of Chemistry and Physics, 55th edition (1975), CRC Press, Ohio, USA.

In order to be able to provide controlled plasma surface treating without depositing undesired components on the surface of the substrate on which the adsorbent layer is to be formed, said process is advantageously carried out by maintaining the total pressure in the plasma generation zone of the DC-arc discharge in the range from about 10 to about 100 kPa and in the glowing zone in the range up to about 1000 Pa. The electron energy of said types of DC-plasma is preferably in the range from 1-10 eV. The contacting time of the substrate with the modified compound originating from the glowing zone is advantageously 1 second to 5 hours for the above process.

Hydrocarbonaceous compounds employed in the plasma glowing zone suitably comprise a monomeric organic compound of an ionizable nature such as hydrocarbons including aromatics, olefins and lower alkanes and hydrocarbons containing at least one heteroatom such as alkylene oxides, organosilanes, halogenated lower hydrocarbons and (acrylo) nitriles. Said hydrocarbonaceous compounds advantageously comprise at least one aromatic monomer, in particular toluene.

The invention will now be described by way of example in more detail with reference to the following examples and accordingly related drawings in which:

DETAILED DESCRIPTION OF THE DRAWINGS

Figure 1A:
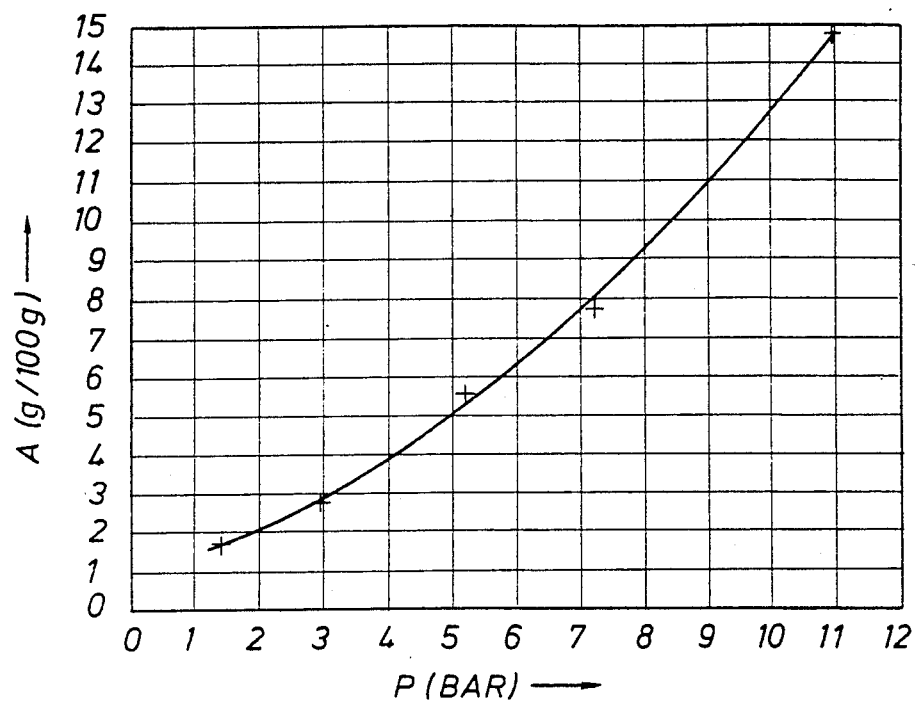
FIGS. 1A and 1B are graphs showing the adsorption of active coal as function of the applied pressure for carbon dioxide and methane respectively as matter to be adsorbed.
Figure 1B:
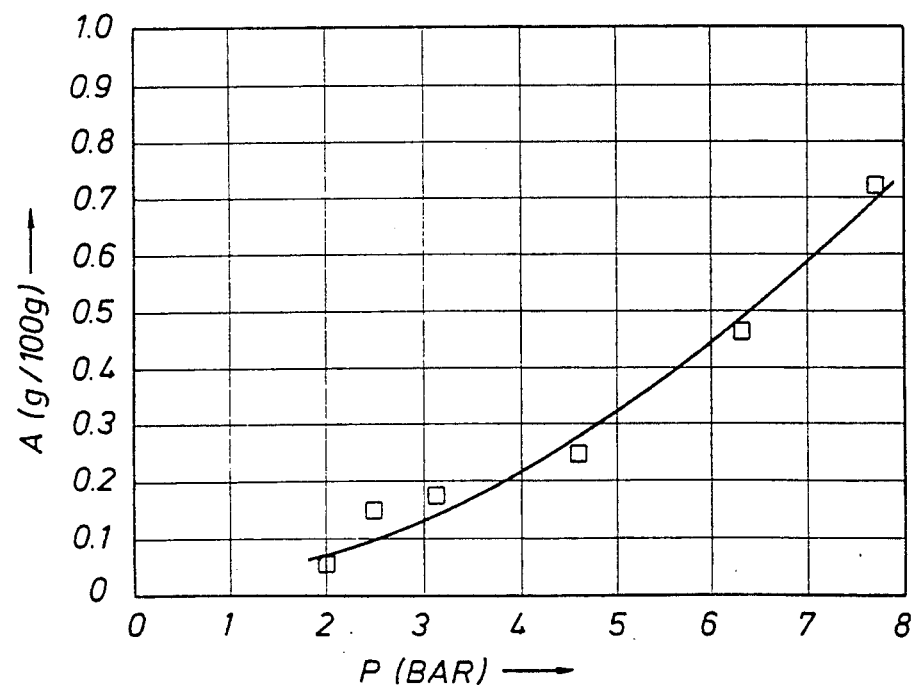

Referring to the FIGS. 1A and 1B as adsorption characteristics graphs of active coal, which is known as an advantageous adsorbent for i.a. carbonaceous compounds, are shown for respectively carbon dioxide and methane as matter to be adsorbed. In said figures the adsorption A is plotted along the vertical axis whereas the pressure p applied for said compounds is plotted along the horizontal axis. The adsorption A is defined as the adsorbed amount of the matter to be adsorbed in grams per 100 grams of the adsorbent. The pressure p of the matter to be adsorbed is measured in bar. As will be clear for skilled persons many conventional techniques can be employed to determine the adsorption A.

For the present FIGS. 1A and 1B active coal, commercially available under trade mark NORIT R1, has been used as adsorbent matter. An amount of 0.25 grams active coal powder has been investigated in a pressure range from 1 to 11 bar at a temperature of 20° C. As is known to those skilled in the art because of a critical temperature for carbon dioxide ($CO_2$) of 31° C. consequently above a well defined pressure value capillary condensation will appear and will give high adsorption rates. On the contrary for methane ($CH_4$) because of its relatively low critical temperature of −82° C. only usual physical adsorption will take place.

Figure 2A:
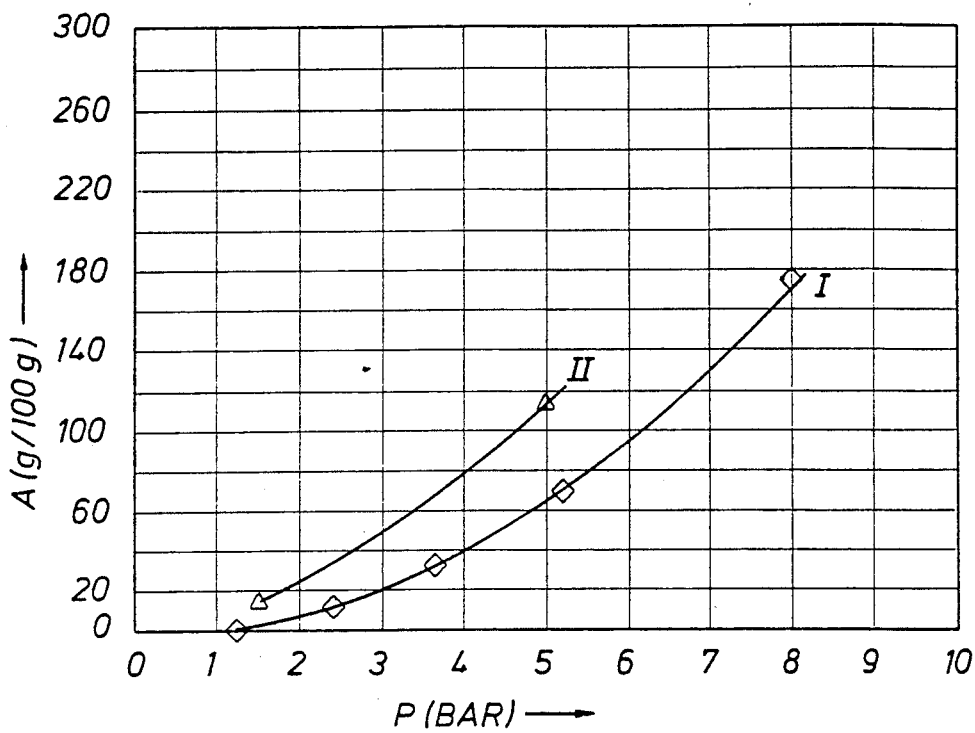
FIGS. 2A and 2B show similar graphs for the adsorption of adsorbent layers produced in accordance with the invention.
Figure 2B:
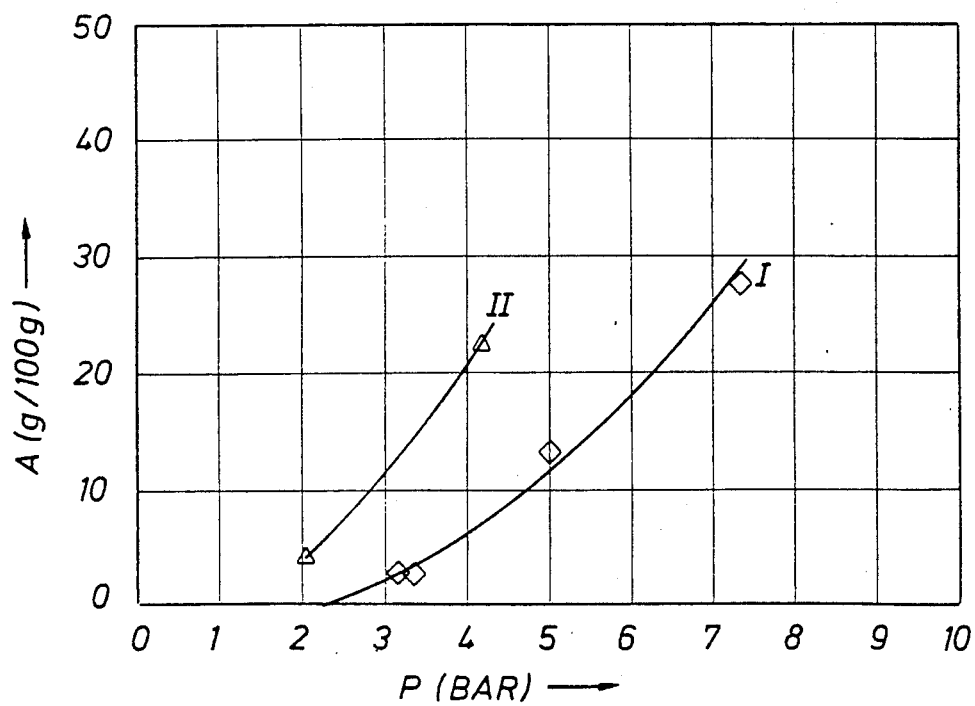

Referring now to the FIGS. 2A and 2B adsorption characteristics for adsorbent layers prepared in accordance with the invention are shown, respectively for carbon dioxide and for methane.

The adsorbent layers which have been employed for the measurements as shown in said FIGS. 2A and 2B are composed all of toluene deposited from a DC-plasma upon an aluminium substrate.

Different experimental conditions for corresponding measurement sets of samples I and II as shown in the FIGS. 2A and 2B are comprised in the following table.

TABLE

| Sample | Voltage (V) | Current (A) | Ratio | Pressure in Plasma Generation Zone ($10^5$ Pa) | Pressure in Reactor Zone (Pa) | Temperature of Substrate (°C.) | Layer Thickness ($\mu$m) |
|---|---|---|---|---|---|---|---|
| I | 63 | 30 | 0.0004 | 0.20 | 57 | 20 | 1.55 |
| II | 63 | 30 | 0.0002 | 0.20 | 85 | 20 | 0.6 |

Surprisingly, now the plasma deposited layers show an unexpectedly high adsorption range, in particular more than one order of magnitude when compared with the above-mentioned active coal results.

Furthermore, it has to be noted that plasma deposited layers of both linear and cyclic monomers like methane, acetylene, cyclohexane, and ethanol gave similar advantageous results for adsorption of $CO_2$ and $CH_4$. For some other alkanes like $C_2H_6$, $C_3H_8$, and $C_4H_{10}$ as matter to be adsorbed like surprising adsorption results have been found.

In all the experiments layer thicknesses between 0.1 $\mu$m and 100 $\mu$m were used. These thicknesses may result in deposition times from 1 second to 5 hours. In an advantageous way the DC-discharge reactor permits fast deposition rates up to 100 nm/s.

Said adsorbent layers have been deposited on a non-permeable metal substrate, in particular aluminium. Advantageously such a composite material forming a layer arrangement results in a solid construction because of the well affixed layer upon said metal substrate. Said construction will be very suitable for technical applications in filter and separation devices.

Various modifications of the present invention will become apparent to those skilled in the art from the foregoing description. Such modifications are intended to fall within the scope of the appended claims.

What is claimed is:

1. A process for the preparation of an adsorbent layer upon a non-permeable substrate, comprising the steps of
   generating a plasma by introducing a non-polymerizable fluid into a plasma generation zone using a direct current arc,
   introducing hydrocarbonaceous monomers into said plasma generation zone thereby forming polymerizable hydrocarbonaceous compounds, setting a ratio of flow rates of the hydrocarbonaceous monomers and the non-polymerizable fluid in the range from >0–0.001, and
   contacting the substrate with the glowing zone of said plasma.

2. The process as claimed in claim 1 wherein said hydrocarbonaceous monomers comprise at least one aromatic monomer.

3. The process of claim 1 wherein said substrate is a metal.

4. The process of claim 3 wherein said metal is aluminium.

5. The process of claim 1 wherein said total pressure in the plasma-generation zone is in the range from about 10 to about 100 kPa and in the glowing zone in the range up to about 1000 Pa.

6. The process of claim 1 wherein said deposition rates are up to 100 nm/s.

7. The process of claim 1 wherein said non-polymerizable fluid is an inorganic gas.

8. The process of claim 7 wherein said inorganic gas is selected from the group of nitrogen, hydrogen and oxygen.

9. The process of claim 7 wherein said inorganic gas is an inert gas.

10. The process of claim 9 wherein said aromatic monomer is toluene.

* * * * *